United States Patent
Orth et al.

(10) Patent No.: US 7,190,053 B2
(45) Date of Patent: Mar. 13, 2007

(54) FIELD DEVICE INCORPORATING CIRCUIT CARD ASSEMBLY AS ENVIRONMENTAL AND EMI/RFI SHIELD

(75) Inventors: Kelly Orth, Apple Valley, MN (US); Chad McGuire, Minneapolis, MN (US)

(73) Assignee: Rosemount Inc., Eden Prairie, MN (US)

( * ) Notice: Subject to any disclaimer, the term of this patent is extended or adjusted under 35 U.S.C. 154(b) by 131 days.

(21) Appl. No.: 10/942,340

(22) Filed: Sep. 16, 2004

(65) Prior Publication Data

US 2006/0055006 A1    Mar. 16, 2006

(51) Int. Cl.
*H01L 23/552* (2006.01)
(52) U.S. Cl. .................. 257/659; 257/660; 257/662
(58) Field of Classification Search ................ 257/659, 257/660, 662
See application file for complete search history.

(56) References Cited

U.S. PATENT DOCUMENTS

| | | | |
|---|---|---|---|
| 2,118,268 A | 5/1938 | Schellenger | 201/48 |
| 2,958,750 A | 11/1960 | Lebens | 200/133 |
| 3,542,988 A | 11/1970 | Baldasare | 200/168 |
| 3,909,726 A | 9/1975 | Dobrovolny et al. | 325/357 |
| 4,313,025 A | 1/1982 | Grube, Jr. | 174/50 |
| 4,384,165 A | 5/1983 | Loving, Jr. et al. | 174/35 |
| 4,424,404 A | 1/1984 | Moore et al. | 17/52 |
| 4,430,520 A | 2/1984 | Tibbetts et al. | 174/35 |
| 4,567,317 A | 1/1986 | Ehrlich | 174/35 |
| 4,596,670 A | 6/1986 | Liu | 252/511 |
| 4,749,821 A | 6/1988 | Linton et al. | 174/35 |
| 4,814,566 A | 3/1989 | Sigl | 200/305 |
| 4,870,863 A | 10/1989 | Duncan et al. | 73/431 |
| 4,878,012 A | 10/1989 | Schulte et al. | 324/60 |
| 4,910,090 A | 3/1990 | Kuhlman et al. | 428/469 |
| 4,936,690 A | 6/1990 | Goetzinger | 374/181 |
| 4,958,938 A | 9/1990 | Schwartz et al. | 374/208 |
| 5,001,298 A | 3/1991 | Jong | 174/35 |
| D317,266 S | 6/1991 | Broden et al. | D10/46 |
| D318,432 S | 7/1991 | Broden et al. | D10/46 |
| 5,033,032 A | 7/1991 | Houghtaling | 367/160 |
| 5,070,216 A | 12/1991 | Thornton | 174/35 |
| 5,128,835 A | 7/1992 | Rudy, Jr. et al. | 361/424 |
| 5,331,059 A | 7/1994 | Engelhardt et al. | 525/340 |
| 5,353,200 A | 10/1994 | Bodin et al. | 361/816 |

(Continued)

FOREIGN PATENT DOCUMENTS

| | | |
|---|---|---|
| GB | 2 169 925 A | 7/1986 |
| JP | 2000-077575 | 3/2000 |

OTHER PUBLICATIONS

Theodore Schnaare et al., entitled "Process Transmitter With Overpressure Vent", filed Nov. 17, 2005, U.S. Appl. No. 11/281,069.
Advertisement by Rosemount Inc. "Asking the Right Questions Leads to Smart Decisions", Jul. 1991.

(Continued)

*Primary Examiner*—Andy Huynh
*Assistant Examiner*—Thinh T Nguyen
(74) *Attorney, Agent, or Firm*—Westman, Champlin & Kelly, P.A.

(57) ABSTRACT

A field hardened industrial device is described with a housing of the device having electrically conductive walls surrounding a cavity with an open end. An electronics assembly is adapted to fit within the cavity. The device includes a circuit card assembly, which is a multi-layered printed wiring board with pass-through electrical connections and an embedded ground plane electrically coupled to the housing to shield the electronics assembly from electromagnetic interference and to provide environmental protection to the electronics assembly.

23 Claims, 6 Drawing Sheets

U.S. PATENT DOCUMENTS

| | | | |
|---|---|---|---|
| 5,371,404 A | 12/1994 | Juskey et al. | 257/659 |
| 5,546,804 A | 8/1996 | Johnson et al. | 73/431 |
| 5,977,626 A | 11/1999 | Wang et al. | 357/707 |
| 6,089,097 A | 7/2000 | Frick et al. | 73/718 |
| 6,122,178 A | 9/2000 | Andrews et al. | 361/600 |
| 6,255,140 B1 | 7/2001 | Wang | 438/122 |
| 6,510,740 B1 | 1/2003 | Behm et al. | 73/708 |
| 6,511,337 B1 | 1/2003 | Fandrey et al. | 439/320 |
| 6,593,857 B1 | 7/2003 | Roper et al. | 340/870.3 |
| 6,609,427 B1 | 8/2003 | Westfield et al. | 73/753 |
| 6,615,665 B1 | 9/2003 | Flogel et al. | 73/715 |
| 6,678,170 B2 | 1/2004 | Barringer et al. | 361/800 |
| 6,717,485 B2 | 4/2004 | Kolb et al. | 333/12 |
| 6,740,959 B2 | 5/2004 | Alcoe et al. | 257/659 |
| 6,744,640 B2 | 6/2004 | Reis et al. | 361/818 |
| 6,747,350 B1 | 6/2004 | Lin et al. | 257/704 |
| 2003/0042925 A1* | 3/2003 | Kirk | 324/765 |

OTHER PUBLICATIONS

Article, "Model 1151 Smart Pressure Transmitter keeps getting better", published in Oct. 1991, from Instrumentation & Control Systems, vol. 64, p. 145.

Rosemount, "Model 1151 Smart Pressure Transmitters," Dec. 1991.

Rosemount Inc., "Model 1151 Smart Pressure Transmitters," Oct. 1990.

Rosemount Inc., "Maximum Flexibility At Minimum Cost," 1983 (date without month provided).

Manual 4592, "Model 2024 Differential Pressure Transmitter," Instruction Manual Jun. 1990.

Rosemount Inc. "Model 3044 Temperature Transmitter," Manual 4562, Aug. 1988.

Rosemount Inc., "Model 3051C Smart Pressure Transmitter," Manual 4622/4623, Jan. 1991.

Color photographs of prior art transmitters (18 sheets).

* cited by examiner

FIELD DEVICE INCORPORATING CIRCUIT CARD ASSEMBLY AS ENVIRONMENTAL AND EMI/RFI SHIELD

FIELD OF THE INVENTION

The present invention relates to electronic field devices, such as process transmitters, that are used to monitor industrial processes. More particularly, the present invention relates to electronic field devices used in industrial process environments that may have high electromagnetic interference (EMI).

BACKGROUND OF THE INVENTION

Generally, electronic field devices (such as process transmitters) are used to monitor the operation of industrial processes such as those in oil refineries, chemical processing plants, paper processing plants, biotechnology plants, pharmaceutical plants, food and beverage plants, and the like. Process transmitters for monitoring an industrial process may measure pressure, flow rate, fluid or material level in a tank, temperature, vibration, and the like. Additionally, such field devices may include analytical electronics, diagnostic electronics, or other process monitoring electronic devices, or even electronic, hydraulic or pneumatic actuator devices used for industrial process control.

Process transmitters are typically positioned within the processing plant in locations where liquids, dust and humidity and various industrial contaminants may be present. In some environments, process liquids such as acid solutions or base solutions can be present. Liquids may also include spray from hoses used to clean plant equipment. Liquids can drip, splash or spray onto the process transmitter and its electrical connections. Additionally, dust, humidity, and liquids in the environment may contaminate and degrade the electrical connections to and within the process transmitter.

Transmitters that include circuitry disposed in a sealed housing and protected by an outer cover are known in the art. It is also known to include one or more actuatable switches for modifying a parameter of the circuit, such as a zero or span setting. Typically, the one or more switches or the field wiring terminals are accessible only after removal of the outer transmitter cover.

Unfortunately, removal of the outer cover exposes the electronics within the transmitter housing to contaminants and electromagnetic and radio frequency interference. One technique for maintaining EMI protection for electronics within the transmitter housing includes an electrically conductive inner cover disposed within the transmitter housing and in frictional contact with electrically conductive walls of the housing to reduce the effects of EMI when the outer cover is removed. One example of a process transmitter with an inner conductive cover is shown and described in U.S. Pat. No. 5,353,200 issued to Bodin et al. and entitled "PROCESS TRANSMITTER WITH INNER CONDUCTIVE COVER FOR EMI SHIELDING" issued Oct. 4, 1994, which is incorporated herein by reference in its entirety.

There is an ongoing need in the art for industrial process transmitter housing configurations with improved humidity and environmental contamination robustness as well as efficient EMI/RFI filtering capabilities. Embodiments of the present invention provide solutions to these and other problems, and offer other advantages over the prior art.

SUMMARY

A field hardened industrial device is described. A housing of the field hardened industrial device has electrically conductive walls surrounding a cavity with an open end. An electronics assembly is adapted to fit within the cavity. A portion of the electronics assembly is a circuit card assembly, which is a multi-layered printed wiring board with pass-through electrical connections and an embedded ground plane electrically coupled to the housing to shield the electronics assembly from electromagnetic interference and to provide environmental protection to the electronics assembly.

In one embodiment, the multi-layered printed wiring board with pass-through electrical connections is sized to fit within the cavity of the device housing. A ground plane embedded within the printed wiring board extends substantially a full extent of the multi-layered printed wiring board. The ground plane is electrically coupled to the device housing to shield electronics within the device housing from electromagnetic interference and to provide environmental protection to the electronics.

Figure 1:
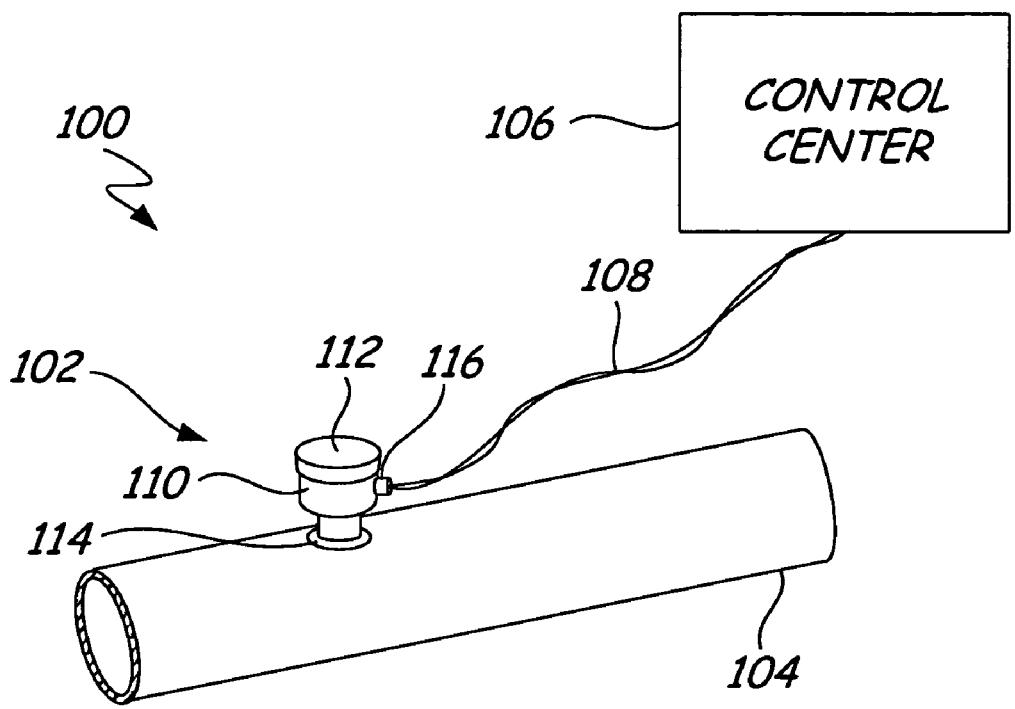
FIG. 1 is a simplified block diagram of a field device according to an embodiment of the present invention.

While the above-identified illustrations set forth embodiments of the present invention, other embodiments are also contemplated, some of which are noted in the discussion. In all cases, this disclosure presents the illustrated embodiments by way of representation and not limitation.

DETAILED DESCRIPTION

The present invention is directed to a field hardened industrial device, such as a process transmitter, preferably utilizing a single compartment electrical housing that maintains EMI protection and environmental protection even with the outer transmitter cover removed. As used herein, the phrase "field hardened industrial device" refers to a device with a housing that is sealed against environmental contamination. In a preferred embodiment, in addition to the housing being sealed against the environmental contamination, the electronics are additionally sealed against environmental contamination, as well as electromagnetic and radio frequency interference. In a preferred embodiment, the environmental seal provided by the circuit card assembly is a hermetic seal. As used herein, the term "hermetic" refers to a seal having a leak rate that is less than approximately $5 \times 10^{-8}$ std cc/sec He (0.00000005 cubic centimeters of Helium per second given at one atmosphere of pressure). Additionally, as used herein, the term "EMI" or "Electromagnetic Interference" refers to interference from electromagnetic radiation containing primarily electrostatic (electrical field or E-field) energy at a frequency between 0 Hz (DC) and approximately 10 GHz.

The present invention incorporates a circuit card assembly (CCA) that serves as an electrical connection from the device electronics to the field wiring and to the local operator interface (LOI) or LCD display on the field wiring side of the device. Moreover, the CCA is provided with an embedded ground plane electrically connected to the electrically conductive device housing to provide EMI shielding. The ground plane of the CCA effectively divides the device housing into two "Faraday cages" and serves as both an environmental shield and EMI barrier.

In general, a Faraday cage is an enclosure formed from conducting materials designed to prevent the passage of electromagnetic waves, either by containing them within or excluding them from its interior. Process transmitters are typically formed from conductive metal and are themselves Faraday cages. Effectively, the exterior surface of the transmitter housing serves as an equipotential surface having essentially the same electrical potential at every point. The principle of the Faraday cage is that a charge on a charged conductor resides only on its exterior surface. If there is no electrical charge inside of the structure, then by Gauss' law and the divergence theorem, there is no electrostatic field inside the equipotential surface, even if the structure is exposed to an external field.

Within the process industry, such conductive structures are utilized to eliminate electric fields within the structure so as to protect electronics from undesired electromagnetic signals. Ideally, electric fields and radio frequencies cannot penetrate the Faraday cage to affect the electronics. It should be appreciated that the Faraday cages of the present invention are not perfect because the housing material (though conductive) is not a perfect conductor, and because the enclosure is provided with an opening for wiring to enter the housing. In addition to moisture and other contaminants, radio frequency interference (RFI) and electromagnetic interference (EMI) can be coupled (conducted) into the electronics within the housing via the wires. Nevertheless, as used herein, the term "Faraday cage" refers to an electrically conductive structure having sufficient Faraday cage properties to shield the enclosed volume from external electromagnetic interference and radio frequency interference.

FIG. 1 illustrates a simplified diagram of a process transmitter system 100 according to an embodiment of the present invention. Process transmitter 102 is coupled to process pipe segment 104 in order to measure a parameter or process variable associated with a fluid contained within the pipe section 104. The transmitter 102 is coupled to control center 106 via a field wiring 108. In general, the field wiring includes both power/ground cabling and a communications link. The field wiring 108 may include two or more wires. In an alternative embodiment, the field wiring 108 provides power and ground connections, but communication between the transmitter 102 and the control center 106 occurs via wireless communications link (not shown).

In general, transmitter 102 includes a housing 110 with a cover 112. A housing 110 is coupled to the pipe segment 104 via a sealed base 114, which may include a coupling flange or other attachment mechanism provided by a customer for a specific installation. A wiring conduit 116 is provided on the housing body 110 to provide an access opening for the field wiring 108 to enter the housing 110 for connecting electronics within the transmitter housing 110 to the control center 106.

A circuit card assembly (CCA) 270 shown in FIG. 2 and discussed below is disposed within the transmitter housing 202, and is provided with an embedded ground plane, which contacts the transmitter housing at several points to complete a ground connection. The CCA isolates electronics disposed below the CCA in the transmitter housing 202 from electromagnetic interference and environmental contaminants, if the transmitter cover 208 is removed.

Figure 2:
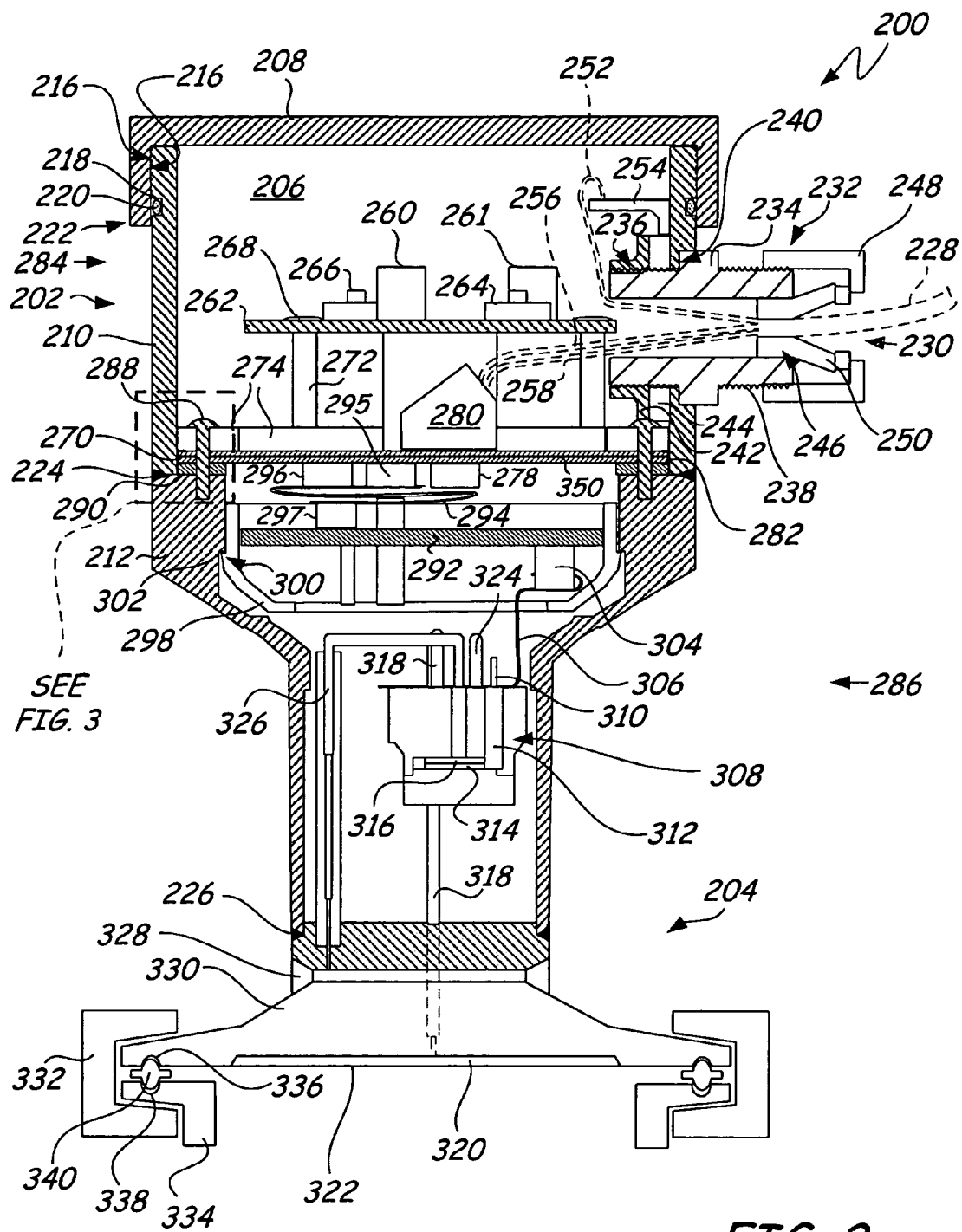
FIG. 2 is a cross-sectional view of a field device, including a circuit card assembly according to an embodiment of the present invention.

FIG. 2 is a cross sectional view of a single compartment transmitter housing according to an embodiment of the present invention. In this example, the transmitter 200 is a pressure transmitter 200 for measuring a fluid pressure in a pipe or vessel of an industrial process. However, the transmitter 200 may include any type of industrial sensor.

The transmitter 200 includes a transmitter housing 202 coupled to a base portion 204 defining an enclosure 206 with an opening. A releasable cover 208 is sized to fit over the opening to seal the enclosure 206 from the environment. The housing 202 includes an upper portion 210 and a lower portion 212. The upper portion 210 is provided with threads 214 on an outer surface sized to mate with threads 216 on an inner surface of the cover 208. Additionally, a recess 218 sized to receive an o-ring seal 220 is preferably provided in the outer surface of the upper portion 208. An overhang portion 222 of the cover 208 compresses the o-ring seal 220 to isolate the enclosure 206 from the environment.

Generally, the upper portion 210 is coupled to the lower portion 212 via weld joint 224 or other conductive means. The lower portion 212 is coupled to the base portion 204 via weld joint 226 or other conductive means.

Field wires 228 extend through wire opening 230 into the upper portion 210 of the housing 202. A conduit connection 232 having a body portion 234 and coupling portions 236 and 238. The body portion 234 is sized to mate with a corresponding recess 240 provided in an outside surface of the upper portion 210 adjacent to the wire opening 230. Coupling portion 236 is provided with threads adapted to mate with a coupling nut 242 within the enclosure 206. A gasket 244 is disposed over the coupling portion 206 between the coupling nut 242 and the inner surface of the upper portion 210 to seal the enclosure 206 around the opening 230. Alternatively, a conduit or entry spud or a preformed receptacle can be welded or permanently attached to the housing directly.

The field wires 228 are positioned within a wire connector 246, and connector nut 248 is threadably attached to coupling portion 238 to fix the field wires 228 in position. In particular, as the connector nut 248 is tightened onto the coupling portion 238, flange portions 250 of the wire connector 246 are forced against the inner surface of the coupling portion 238 causing the wire connector 246 to clamp the field wires 228 into position.

Within the enclosure 206, the field wires 228 are broken out into individual leads, including a ground lead 252 coupled to a ground lug 254 and a power lead 256 and a signaling lead 258 coupled to spring loaded electrical contacts 280 provided on coupling board 270. The coupling board 270 is readily accessible to an operator in the field upon removal of cover 208. The Local Operator Interface (LOI) board 262 connects to the coupling board 270 and provides easy access to field device elements that may need to be accessed, including the span setting push button 264 and the zero setting push button 266 for resetting the transmitter 200, as well as the alarm switch 260 and the write protect switch 261.

In this embodiment, the LOI board 262 is fixed within the upper portion 210 of the transmitter housing 202 via screws 268 and is separated from the circuit card assembly or coupling board 270 by standoffs 272 and by clamping ring 274. Clamping ring 274 mates with coupling board 270, which in turn mates with seal 290. Threaded fasteners 288 extend through the clamping ring 274, the coupling board 270 and through seal 290 and into the lower portion 212 of housing 202, fixing the coupling board 270 in place. In general, fasteners 288 may include bolts, screws, or other threaded fastening elements. Alternatively, the fasteners 288 need not be threaded, and may include fasteners such as pins, drive screws and the like.

A radio frequency interference filter (RFI filter) 278 located on the coupling board 270 capacitively couples the pins of the field wiring connector 280 to the ground plane 350 and hence to the transmitter housing 202. The RFI filter 278 is adapted to filter radio frequency interference, which may be coupled in on the field wiring 228, and generally to protect the electronics assembly from line conducted interference.

Finally, the circuit card assembly (CCA or coupling board) 270 is preferably comprised of a multi-layered printed wiring board (PWB) that is plated on its outer circumferential edge with a conductive layer 282. Generally, the PWB is formed from an insulating material, such as ceramic, plastic, and the like, on which wire traces and electrical interconnections can be formed.

As will be discussed in greater detail below, the coupling board 270 includes an embedded ground plane 350, which extends substantially the entire diameter of the coupling board 270 and which couples to the conductive layer 282. The embedded ground plane 350 is a planar layer disposed within the CCA 270 and extending substantially the entire diameter of the CCA 270. The embedded ground plane 350 is formed from a conductive material (such as copper), and is intended to electrically connect with the conductive walls of transmitter housing 202 to shield the electronics assembly from EMI. In general, the electrical connection between the ground plane 350 and the housing 202 may be completed through the conductive layer 282, via fasteners 288, through the conductive edge layer 282, or by other means. In one embodiment, seal 290 is electrically conductive and the ground path is established through the seal 290.

By electrically coupling the ground plane to the housing 202, the CCA 270 effectively divides the housing 202 into two Faraday cages (Faraday cage 284 above the CCA 270 and Faraday cage 286 below the CCA 270).

In this embodiment, within the lower portion 212 of the housing 202, the CCA 270 is coupled to a transmitter circuit card assembly (CCA) 292 via a flexible circuit 294. Connector 296 couples the flexible circuit 294 to the CCA 270. Connector 297 couples the other end of the flex circuit 294 to the transmitter CCA 292. A heat sink 295 is preferably fixed between the CCA 270 and the flex circuit 294 to provide a thermal conduction path for any heat generating components located on flex circuit 294.

The transmitter CCA 292 is seated within a cup 298, which has a hook 300 adapted to mate with a recess 302 provided in the lower portion 212. The hook 300 secures the cup 298 in position within the lower portion 212. A connector 304 couples flexible circuit 306 to the low-level transmitter CCA 292, which in turn connects to the pressure sensor 308 via contact pins 310.

In the embodiment shown, the pressure sensor 308 includes a glassed feed through 312 for the electrical contact pins 310. The glassed feed through 312 extends to the environmentally sealed sensing diaphragm 314 adjacent to the oil filled cavity 316 within the sensor 308. An oil filled tube 318 connects the sensor 308 to the cavity 320 adjacent to the isolating diaphragm 322, which is coupled to the process.

A fill tube 324 is provided on sensor 308 to backfill the oil filled cavity 316, tube 318 and cavity 320 to the desired level. An air filled tube 326 connects the sensor 308 to a vent to atmosphere 328, which allows the transmitter to measure gage pressure.

Finally, the base 330 is preferably coupled to the process by a clamp 332 and flange 334 provided by the customer to mate with their particular implementation. Recesses 336 and 338 provided in the base 330 and the flange 334 are sized to receive gasket 340, which seals the base 330 to the flange 334.

In general, it should be understood by a worker skilled in the art that the present invention may be used with any type of sensing element, not just the gage pressure sensor shown. In particular, the CCA 270 of the present invention may be used with any process transmitter, provided the skin depth of the ground plane embedded within the CCA 270 is of a thickness sufficient to effectively isolate the electronics from EMI, which may be coupled in on the field wiring 228 or which may be introduced from the operating environment when the outer cover 208 is removed. Additionally, the present invention may be used with any field-hardened industrial device, including remote meters, wireless gateways, remote monitoring units, industrial process transmitters, and the like.

Figure 3:
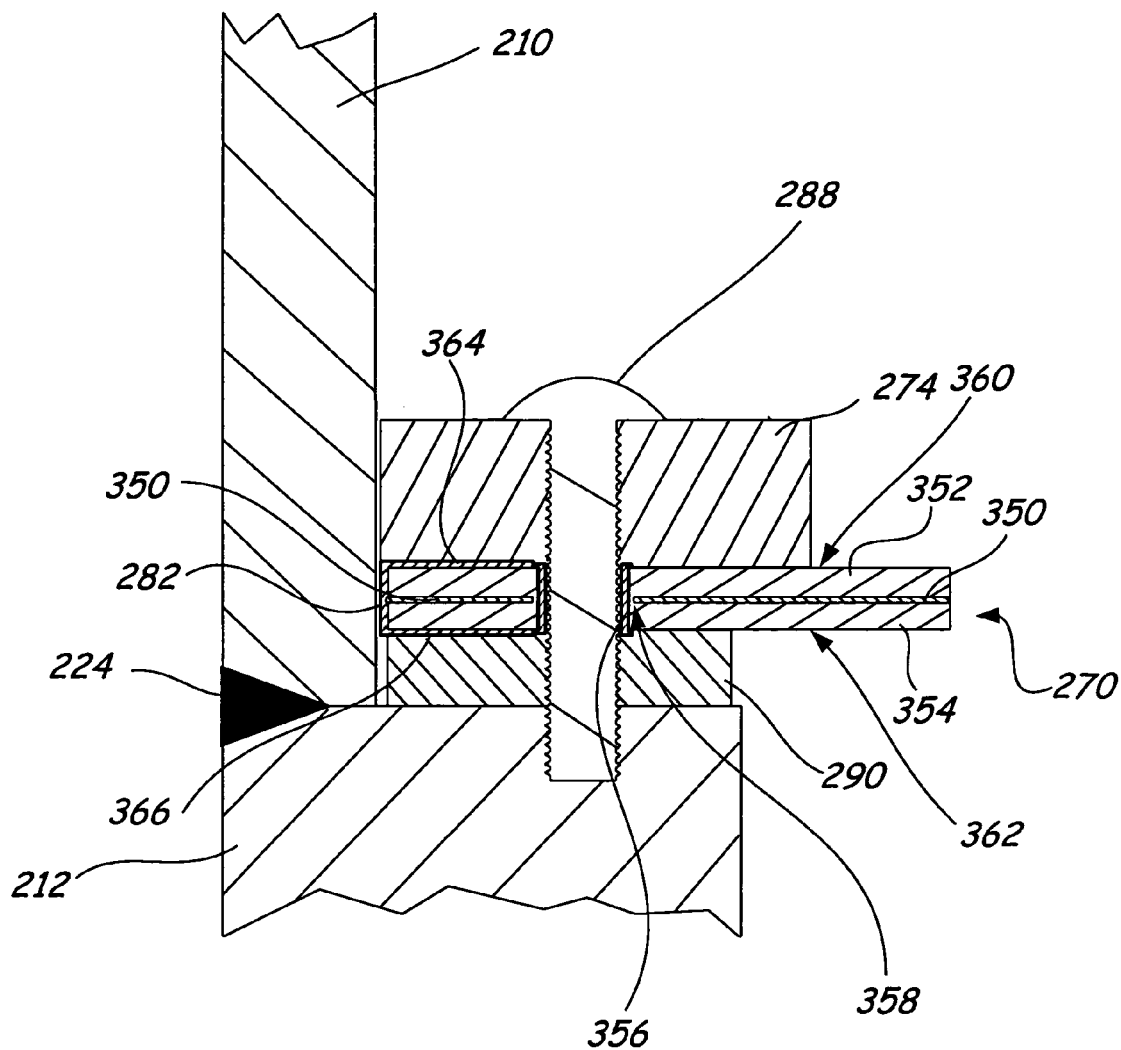
FIG. 3 is an expanded cross-sectional view of a portion of the circuit card assembly according to an embodiment of the present invention.

FIG. 3 illustrates an expanded cross-sectional view of the CCA 270 and a portion of the assembly where the upper portion 210 and lower portion 212 of the housing 202 are welded by weld joint 224. As previously discussed, the edge of the CCA 270 is plated with a conductive layer 282. In general, the CCA 270 is a multi-layered substrate, including an embedded ground plane 350 sandwiched between upper layer 352 and lower layer 354. Generally, the upper and lower layers 352 and 354 and ground plane 350 are portions of a multi-layer printed wiring board (PWB). Generally, the exposed planar surfaces 360 and 362 are water resistant. However, during the fabrication process, holes are drilled and edges of the substrate are cut to form the PWB 270. These exposed edges have exposed fibers, which can act as wicks to draw moisture into the substrate layers 360 and 362. To prevent this, the edge of the PWB 270 is plated with a conductive layer, such as copper or tin, that also serves as a diffusion barrier to humidity and contaminants. Additionally, each via or hole is plated.

As previously discussed, threaded fastener 288 extends through the clamping ring 274, through the CCA 270, through gasket 290 and into the lower portion 212. The opening through the CCA 270 that accepts threaded fastener 288 is also plated by a conductive layer 356 to prevent moisture from entering the board through the opening. Depending on the specific implementation, the ground plane 350 may be etched away from the plated layer 356 of the holes to prevent a short to ground via the threaded fastener. Alternatively, the plated layer 356 may provide a path to the ground for the ground plane 350, depending on the specific implementation.

As previously discussed, the threaded fastener 288 frictionally mates with the conductive lower portion 212 (and/or upper portion 210 of the housing 202 and the PWB conductive layer 364, and electrically connects to the ground plane 350 via conductive layer 356 or conductive layer 282 to shield the sensor electronics (such as sensor 308 in FIG. 2) from EMI.

In one embodiment, the seal 290 is an electrical insulator, which prevents the CCA 270 from frictionally mating with the housing 202. Clamping ring 274 frictionally mates with a conductive trace on the outer surface of the CCA 270, while threaded fasteners 288 ultimately provide the ground path to the housing 202. If seal 290 is electrically conductive (such as with commercially available EMI gaskets), the ground path could be made through seal 290 instead of through threaded fastener 288.

Figure 4A:
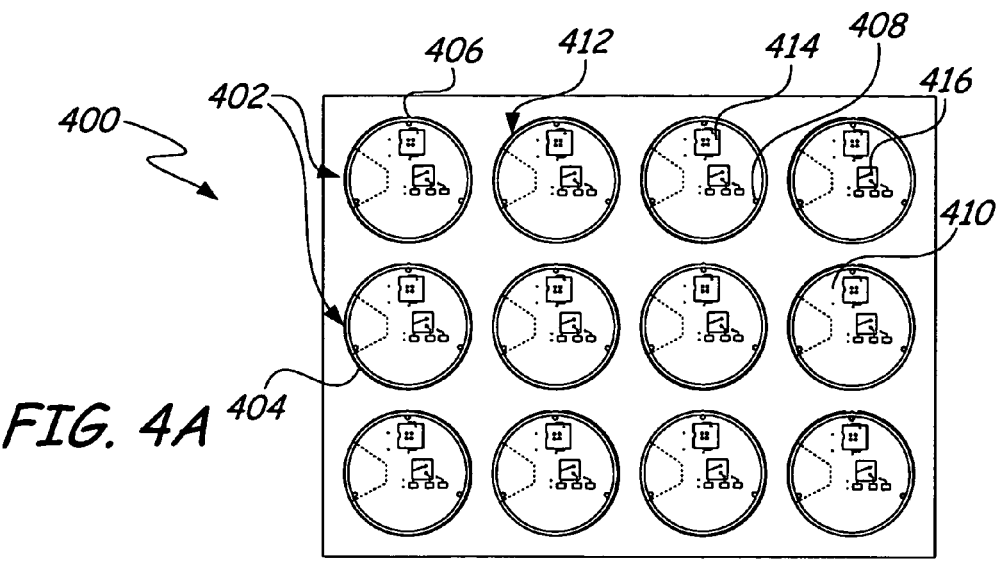
FIG. 4A is a simplified top view of a printed circuit substrate including a plurality of circuit card assemblies according to an embodiment of the present invention.

FIG. 4A is a top plan view of a substrate 400 on which multiple PWBs 402 have been produced. In general, the multi-layered substrate 400 is manufactured, then the individual PWBs 402 are routed, drilled, etched and plated to produce the completed circuit card. Specifically, the outline of the PWB 402 is cut through the board, such as route channel 404. The route channel 404 is not continuous. The PWB 402 is cut out, except for small tab portions 406, which secure the PWB 402 in the plane of the substrate 400.

Fastener openings 408, electrical connection vias 410, and component thru-holes 416 are formed in the PWB 402. The edge of the board (channel 404) and the openings 408, vias 410, and component thru-holes 416 are coated with a conductive layer 412. To assist an operator in completing the installation using the PWB 402, connector outlines and text may be printed on the PWB 402 as indicated by reference numeral 414.

Figure 4B:
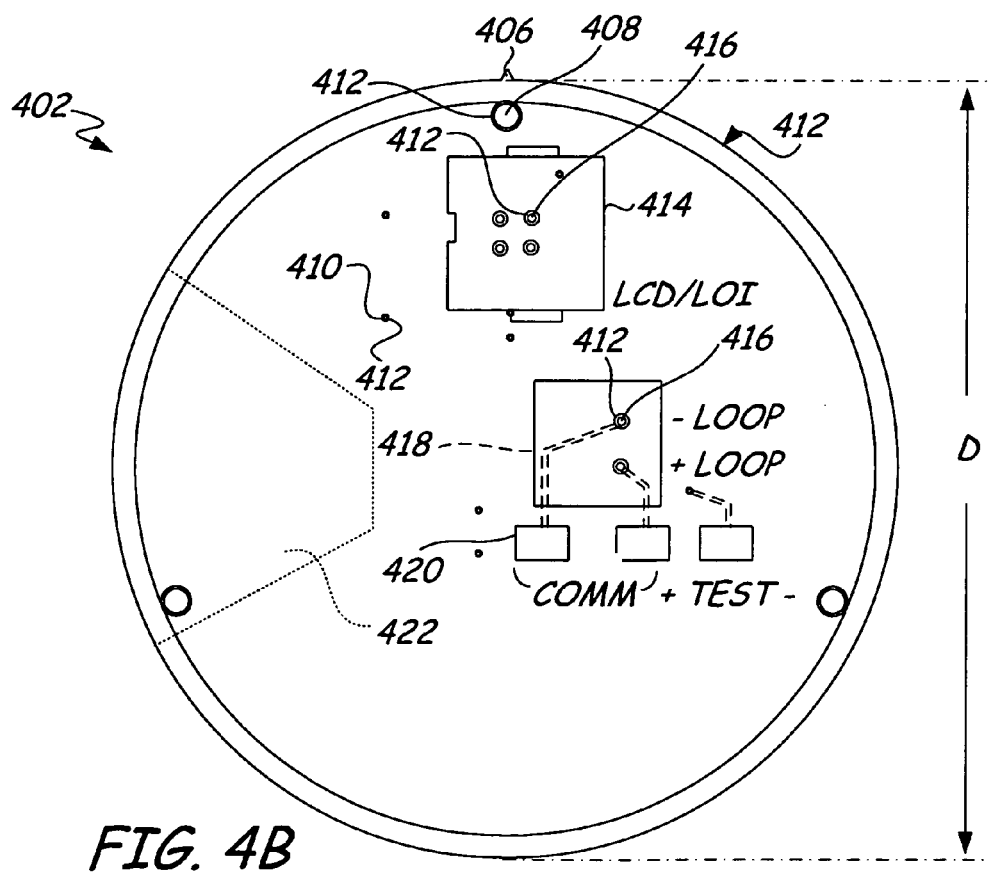
FIG. 4B is an expanded top view of one of the circuit card assemblies of FIG. 4A.

FIG. 4B illustrates an expanded top view of a PWB 402, such as those shown in FIG. 4A. Later, after assembly of the components to the PWB 402, the PWB is referred to as the circuit card assembly or CCA 402. After component assembly, the CCA 402 is broken out from the substrate 400, leaving tab portion 406, which is not coated with the conductive layer 412 on its tip. The electrical connection between the conductive layer 412 and the electronic device or transmitter housing (such as transmitter housing 202 in FIG. 2) is sufficient to provide EMI shielding for electronics in the housing. Moreover, relative to the circumferential area that is coated by the conductive layer 412, the small exposed area of the tab portion 406 does not present a significant moisture "wicking" problem and could easily be coated over with epoxy or the like to further improve the moisture resistance.

For complete protection against the moisture "wicking" problem, the channel 404 in the PWB panel can be routed through tabs 406 at a partial depth such that ground plane layer 350 and lower conductor layer 366 are completely exposed around the entire circumference of the PWB 402 without any breaks or gaps. When conductive layer 282 is plated on the PWB 402, the conductive layer 282 covers the entire edge of the PWB 402 between layer 350 and layer 366. This provides a complete diffusion barrier to prevent moisture from entering the lower portion of the housing through the edge of the PWB. It is important to note that moisture entering through the remaining exposed edge of the PWB 402 in the area of the cut out tabs 406 enters only into layer 352 of the PWB 402. Moisture is prevented from entering into layer 354 of the PWB 402 and from there into the lower portion of the housing by conductive layers 282, 350, 356 and 366 and by seal 290.

The CCA 402, in addition to the openings 408 and vias 410, includes contact pads 420 for establishing an electrical connection with a circuit element (not shown). Underlying electrical trace lines 418, which may be traced on an inner layer of the board, are shown in phantom. Finally, a heat fin 422 is provided to assist in transferring heat away from the electrical components mounted to the CCA 402 or thermally coupled to CCA 402 via heat sink 295.

Finally, it should be understood that the ground plane (shown in FIGS. 2, 3, 5A, 5B, 6A and 6B) extends a substantially a full diameter (D) of the PWB 402. In certain areas, the ground plane is etched away to prevent undesired shorting to ground of various electrical traces, electrical component pins, and/or vias. In general, etched areas are sized to be as small as possible, in order to prevent undesired leakage of EMI and/or moisture diffusion through the ground plane.

It should be understood by a worker skilled in the art that the PWB 402 may be formed in any shape desired. Though it is shown as a substantially circular shape, the PWB may be square, elliptical, triangular, or of any other shape desired. In any case, the ground plane extends substantially a full extent of the PWB.

Figure 5A:
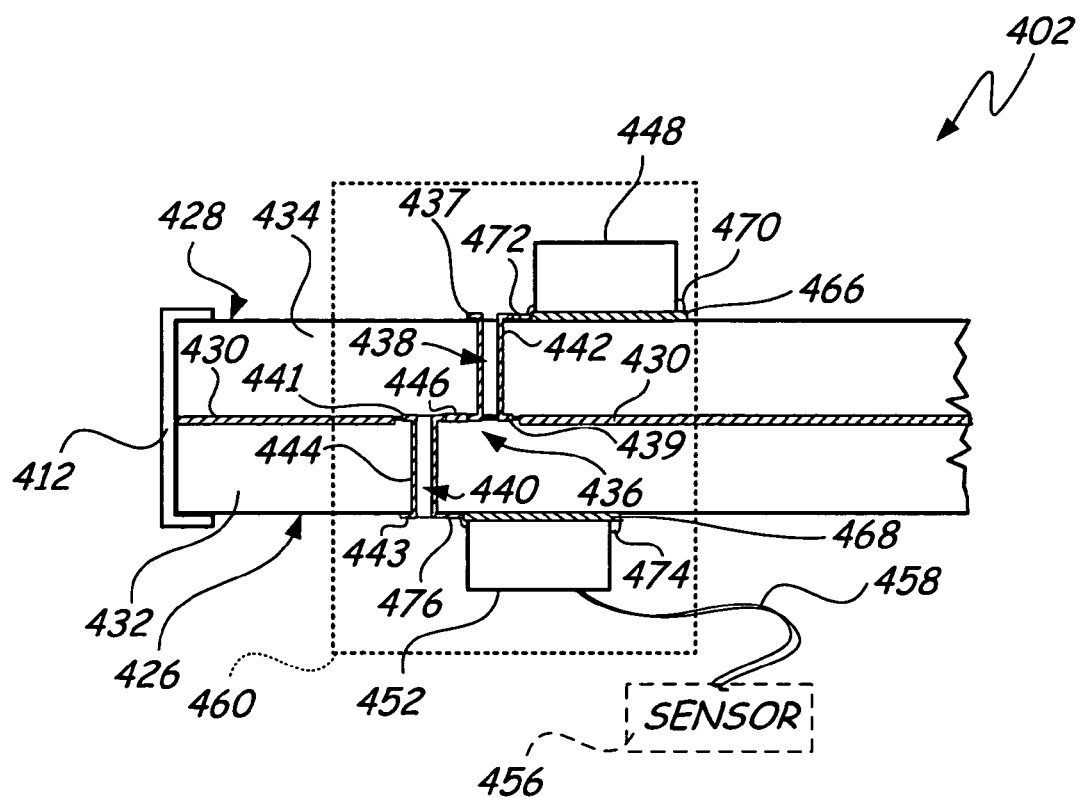
FIG. 5A is an expanded cross-sectional view of a blind via through a circuit card assembly according to an embodiment of the present invention.

FIG. 5A shows an expanded cross-sectional view of a portion of a PWB 402 according to an embodiment of the present invention. The PWB 402 is provided with a ground plane 430, which is electrically coupled to the conductive layer 412 on the edge of the PWB 402. A first via 438 extends from an field wiring exposed surface 428 of the upper board 434 to etched area 436, where the ground plane 430 has been removed. A second via 440, which is offset from the first via 438 extends from the etched area 436 to the sensor exposed surface 426 of the lower board 432. The first via 438 is lined with a conductive layer 442, and the second via 440 is lined with conductive layer 444. A trace line 446 completes the electrical circuit between the first and second vias 438 and 440. Thus, a circuit element 448 can be electrically coupled to circuit element 452 through the electrically coupled vias 438 and 440, without providing a direct path for contaminants to pass from the field wiring side through the PWB 402 to the sensor 456 and flexible circuit 458. This particular arrangement may be referred to as a blind or staggered via.

In general, to establish the electrical connection without shorting the via to ground, the ground plane 430 is etched away immediately adjacent to the vias 438 and 440 and the trace line 446. Conductive mounting pad 466 is provided on the field wiring exposed surface 428 and coupled to conductive layer 442 of via 438 by trace 472 and by via pad 437. Circuit element 448 is fixed to mounting pad 466 by solder joint 470. Similarly, a conductive mounting pad 468 is provided on the sensor exposed surface 426 for mounting electrical component 452 via solder joints 474. The conductive mounting pad 468 is coupled to conductive layer 444 of via 440 by trace 476 and by via pad 443. Though the etched area 436 introduces another flaw in the Faraday cage, by confining the etched area 436 to the immediate vicinity of the vias and the trace line, the etched area 436 allows negligible EMI leakage.

Figure 5B:
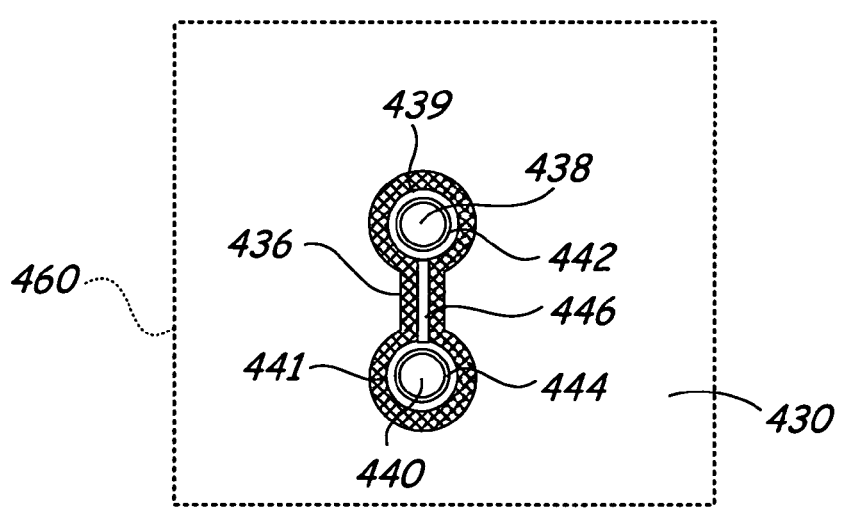
FIG. 5B is a simplified block diagram of a top view of a ground plane and via interconnection layer taken along dotted-line 460 in FIG. 5A according to an embodiment of the present invention.

FIG. 5B illustrates the etched area 436 of the ground plane 430 through a portion 460 of the PWB 402. First via 438 lined by conductive layer 442 extends into the board to the etched area 436, where the ground plane 430 has been removed. Trace line 446 couples a via pad 439, which is electrically coupled to the conductive layer 442 of the first via 438, to via pad 441, which is electrically coupled to conductive layer 444 of second via 440. The first via 438 and the second via 440 are offset from one another to prevent a direct path for moisture and contaminants to pass through the board.

In general, the etched area 436 is sized as small as possible, and is preferably sized just large enough to accommodate the trace line 446 and the two vias 438 and 440 without shorting the elements to ground. Preferably, the etched area has a maximum linear extent of about 10 millimeters or less to limit the amount of EMI and moisture, which can diffuse through the etched area 436.

Thus, the ground plane 430 serves as both an EMI barrier and a humidity shield or environmental diffusion barrier. More specifically, the ground plane provides a path to the housing for EMI, and the transmitter housing provides a path to ground for EMI, shielding electronics beneath the printed wiring board 270 within the housing from EMI. Moreover, the conductive layer plating the edge of the board prevents moisture from wicking into the printed wiring board, and the ground plane provides a diffusion barrier to moisture, such that even if moisture somehow bypasses the conductive layer and enters the upper layer of the coupling board, it is halted by the ground plane and prevented from passing all the way through the coupling CCA 270 to the electronics housed below.

Figure 6A:
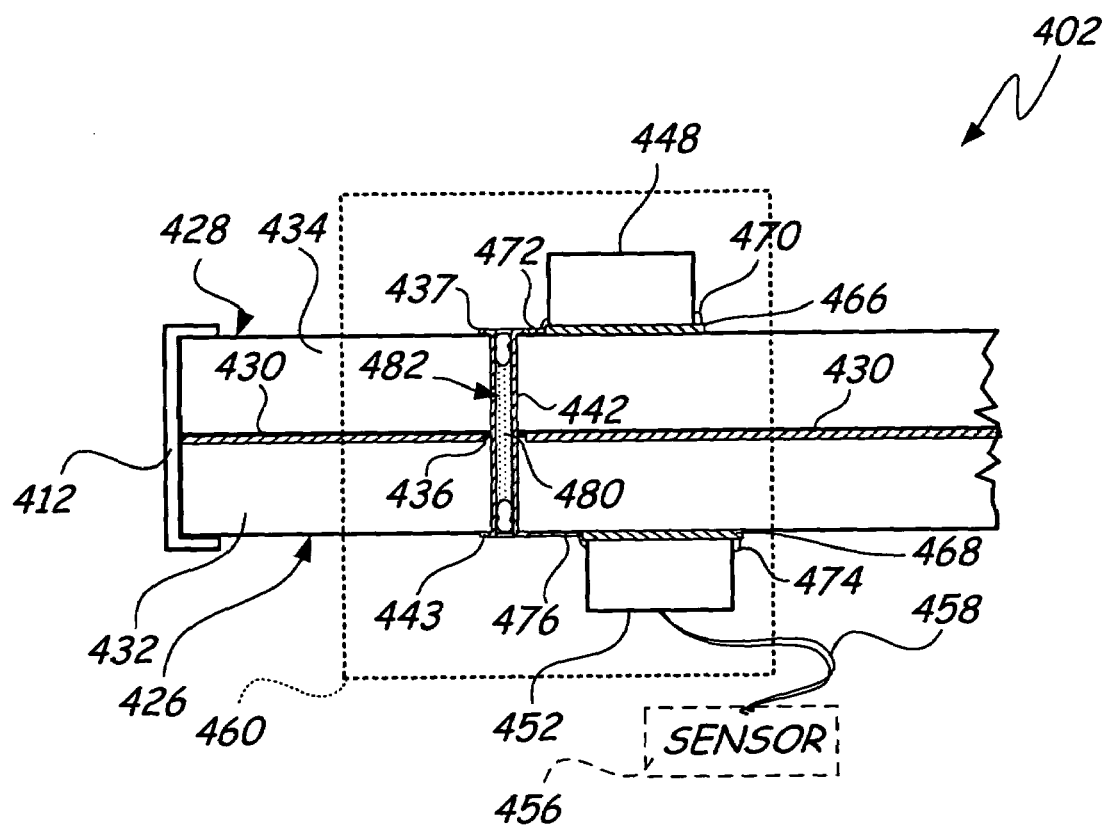
FIG. 6A is an expanded cross-sectional view of a via through a circuit card assembly according to an embodiment of the present invention.

FIG. 6A shows an expanded cross-sectional view of a portion of a PWB 402 according to a preferred embodiment of the present invention, wherein via 482 extends straight through the PWB 402. The PWB 402 is provided with a ground plane 430, which is electrically coupled to the conductive layer 412 on the edge of the PWB 402. A via 482 extends from an field wiring exposed surface 428 of the upper board 434 through etched area 436, where the ground plane 430 has been removed, and to the sensor exposed surface 426 of the lower board 432. The via 482 comprises a first via pad 437 on surface 428 and a second via pad 443 on surface 426, and is lined with a conductive layer 442 in the via hole. Conductive layer 442 electrically connects via pad 437 to via pad 443. Solder 480 extends into and plugs via 482 for environmental protection.

In general, to establish the electrical connection without shorting the via 482 to ground, ground plane 430 is etched away immediately adjacent to the via 482. Electrically conductive mounting pad 466 is provided on the field wiring exposed surface 428 and coupled to conductive layer 442 by trace 472 and by via pad 437. Circuit element 448 is fixed to mounting pad 466 by solder joint 470. Similarly, a conductive mounting pad 468 is provided on the sensor exposed surface 426 for mounting electrical component 452 via solder joints 474. The conductive mounting pad 468 is coupled to conductive layer 442 by trace 476 and via pad 443. Though the etched area 436 introduces another flaw in the Faraday cage, by confining the etched area 436 to the immediate vicinity of the via 482, the etched area 436 allows negligible EMI leakage through the PWB 402.

Figure 6B:
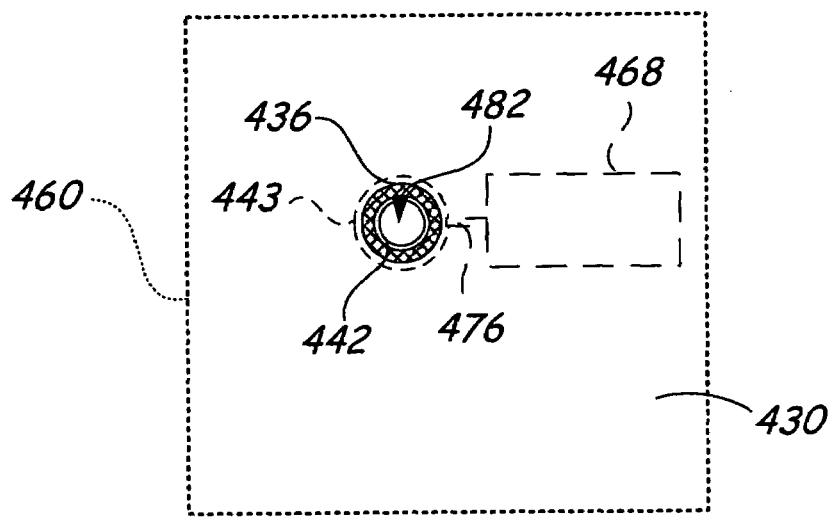
FIG. 6B is a simplified block diagram of a top view of a ground plane and via interconnection layer taken along dotted-line 460 in FIG. 6A according to an embodiment of the present invention.

FIG. 6B illustrates the etched area 436 of the ground plane 430 through a portion 460 of the PWB 402. Via 482 lined by conductive layer 442 extends entirely through the board and through etched area 436, where the ground plane 430 has been removed. The etched area 436 is sized as small as possible, and is preferably sized just large enough to accommodate via 482 without shorting the conductive layer 442 to ground. A via pad 443 is shown in phantom, since via pads 437 and 443 are formed on the exposed surfaces 426 and 428 of the board for via 438. If the vias are offset such as shown in FIG. 5B, via pads may be provided on both the etched area 436 of ground plane 430 and on the exposed surfaces 426 and 428. Generally, the via pads 437 and 443 are only slightly larger than and concentric to the via 482 (and via pads 439 and 441 are only slightly larger than and concentric to via 440 in FIG. 5B).

It should be understood that vias are typically coupled to electrical components using trace lines and contact pads. Openings and holes sized to receive electrical leads or pins of electrical components may be larger or of varying sizes. However, openings of all sizes in the printed wiring board are plated with a conductive layer, both to prevent wicking into the layers of the printed wiring board and to provide an electrical path for interconnecting electrical elements through the board. Depending on the specific implementation and/or type of connection, the holes and openings may employ staggered ("blind") or direct paths through the board, as described above with respect to vias.

As used herein, the term "pass-through electrical connection" refers to an electrical connection or pathway formed through the board. Preferably, the pass through electrical connection is adapted to permit electrical conductivity through channels or vias in the board while preventing undesired moisture and other contaminants from passing through the board. A pass-through electrical connection may be made using a "blind-via" configuration such as that shown in FIG. 5B or a straight or direct via configuration such as that shown in FIG. 6B.

As electrical signals are carried into the assembly on field wiring and transmitted through the CCA 270, the signal is permitted to pass-through the CCA 270 to the shielded electronics while EMI is filtered out by the embedded ground plane 430 and while environmental contaminants are stopped by the CCA 270. Thus, the ground plane 430 serves as both an EMI barrier and a humidity shield or environmental diffusion barrier. More specifically, the ground plane provides a path to the housing for EMI, and the electronic device housing provides a path to ground for EMI, shielding electronics beneath the printed wiring board within the housing from EMI. Moreover, the conductive layer plating the edge of the board prevents moisture from wicking into the printed wiring board, and the ground plane provides a diffusion barrier to moisture, such that even if moisture somehow bypasses the conductive layer and enters the upper layer of the coupling board, it is halted by the ground plane and prevented from passing all the way through the coupling CCA to the electronics housed below.

It should be understood by a worker skilled in the art the CCA of the present invention can be fabricated using standard PWB manufacturing processes. It also should be understood that the ground plane embedded within the CCA of the present invention must be sufficiently thick to shield the sensor electronics from electromagnetic interference. Depending on the frequency of the interference, the thickness of the ground plane may need to be adjusted to achieve the desired skin effect. The "skin effect" refers to the tendency of a high-frequency electrical current to distribute itself within a solid conductor so that the current density near the surface of the conductor is greater than at its core. To make use of the Faraday cage principle, the ground plane must be sufficiently thick to diffuse high frequency EMI and to ground it to the housing, thereby isolating the sensor electronics and other circuitry from undesired electromagnetic and radio frequency interference.

By coating cut edges and openings of the board with conductive material and by maximizing the coverage of the ground plane to all but a very small percentage of the board, the CCA of the present invention serves as both an EMI barrier and an environmental shield. This makes it possible to use electronic device structures with a single opening that allows access to both field wiring terminals and Local Operator Interface (LOI) or Liquid Crystal Display (LCD) terminals with only one cover, while protecting sensitive electronic circuits within the housing. Additionally, by having only one cover, the electronic device has a more compact "in-line" form factor.

Although the present invention has been described with reference to preferred embodiments, workers skilled in the art will recognize that changes may be made in form and detail without departing from the spirit and scope of the invention.

What is claimed is:

1. A field hardened industrial device comprising:
a housing having electrically conductive walls surrounding a cavity having an open end;
an electronics assembly adapted to fit within the cavity; and
a circuit card assembly adapted for electronic coupling to the electronics assembly, the circuit card assembly comprising a multi-layered printed wiring board with pass-through electrical connections and an embedded ground plane electrically coupled to the housing to shield the electronics assembly from electromagnetic interference and to provide environmental protection to the electronics assembly.

2. The industrial device of claim 1 wherein the circuit card assembly further comprises:
a conductive layer disposed on edges of the circuit card assembly and adapted to prevent moisture penetration through the edges of the multi-layered printed wiring board.

3. The industrial device of claim 2 wherein the conductive layer is electrically coupled to the embedded ground plane, and wherein the circuit card assembly is sized to contact the conductive walls of the housing with the edges to electrically couple the embedded ground plane to the housing.

4. The industrial device of claim 1 further comprising:
an outer cover adapted to removably fasten onto the housing over the open end.

5. The industrial device of claim 1 further comprising:
radio frequency interference filters coupled to the circuit card assembly to protect the electronics assembly from line conducted interference.

6. The industrial device of claim 1 wherein the circuit card assembly comprises:
two or more printed wiring boards;
the embedded ground plane disposed between the two or more printed wiring boards; and
a conductive edge layer disposed over the edges of the two or more printed wiring boards and the ground plane.

7. The industrial device of claim 6 wherein the two or more printed wiring boards are formed from insulating material with vias and metallic traces formed in their surfaces to provide electrical interconnections.

8. The industrial device of claim 1 wherein the ground plane comprises:
a conductive layer extending substantially an entire diameter of the circuit card assembly.

9. The industrial device of claim 1 wherein the industrial device further comprises:
a seal disposed between the circuit card assembly and the electrically conductive walls of the housing.

10. The industrial device of claim 9 wherein the seal comprises an electrically insulating seal adapted to electrically isolate the circuit card assembly from the housing.

11. The industrial device of claim 9 wherein the seal comprises an electrically conductive seal adapted to electrically couple the embedded ground plane to the housing.

12. The industrial device of claim 9 wherein the seal and the circuit card assembly form a hermetic seal with the housing to provide environmental protection to the electronics assembly.

13. The industrial device of claim 4 wherein the outer cover is conductive and wherein the ground plane divides the housing into two Faraday cages sufficient to isolate electronics within the housing from electromagnetic interference.

14. The industrial device of claim 1 further comprising:
a wire opening in a portion of the housing sized to receive field wiring, the field wiring for coupling the device to an industrial process control system or monitor.

15. The industrial device of claim 14 wherein the field wiring is electrically connected to the circuit card assembly.

16. The industrial device of claim 1 wherein the electronics assembly comprises:
a process sensor adapted to monitor an industrial process; and
circuitry coupled to the process sensor.

17. The industrial device of claim 1 further comprising:
an actuatable switch disposed in an upper portion of the housing and electrically connected to the circuit card assembly, the actuatable switch adapted to modify a parameter of a process circuit.

18. A transmitter for use in an industrial process comprising:
a housing having electrically conductive walls surrounding a cavity having an open end;
an electronics assembly adapted to fit within the cavity; and
a circuit card assembly adapted for electronic coupling to the electronics assembly, the circuit card assembly comprising a multi-layered printed wiring board with pass-through electrical connections and an embedded ground plane coupled to the housing to shield the electronics assembly from electromagnetic interference and to provide environmental protection to the electronics assembly.

19. The transmitter of claim 18 further comprising:
an outer cover adapted to removably fasten onto the housing over the open end.

20. The transmitter of claim 18 further comprising:
radio frequency interference (RFI) filters coupled to the circuit card assembly to protect the electronics assembly from line conducted interference.

21. The transmitter of claim 18 wherein the multi-layered printed wiring board comprises:
two or more printed wiring boards;
the embedded ground plane disposed between the two or more printed wiring boards; and
a conductive edge layer disposed over the edges of the two or more printed wiring boards and the ground plane.

22. The transmitter of claim 21 wherein the two or more printed wiring boards are formed from insulating material with vias and metallic traces formed in their surfaces to provide electrical interconnections.

23. The transmitter of claim 18 wherein the ground plane comprises:
a conductive layer extending substantially a full extent of the circuit card assembly.

* * * * *